United States Patent
Ashikhmin (10) Patent No.: US 9,286,154 B2
(45) Date of Patent: Mar. 15, 2016

(54) ERROR CORRECTION FOR ENTANGLED QUANTUM STATES

(71) Applicant: Alcatel-Lucent USA Inc., Murray Hill, NJ (US)

(72) Inventor: Alexei Ashikhmin, Morristown, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 272 days.

(21) Appl. No.: 13/912,654

(22) Filed: Jun. 7, 2013

(65) Prior Publication Data

US 2014/0365843 A1 Dec. 11, 2014

(51) Int. Cl.
*H03M 13/00* (2006.01)
*G06F 11/10* (2006.01)
*G06N 99/00* (2010.01)
*H03M 13/11* (2006.01)

(52) U.S. Cl.
CPC ............. *G06F 11/10* (2013.01); *G06N 99/002* (2013.01); *H03M 13/1148* (2013.01)

(58) Field of Classification Search
CPC .. G06F 11/10; G06N 99/002; H03M 13/1148
See application file for complete search history.

(56) References Cited

U.S. PATENT DOCUMENTS

| | | | |
|---|---|---|---|
| 4,775,979 A | | 10/1988 | Oka |
| 5,768,297 A | * | 6/1998 | Shor .............................. 714/763 |
| 6,678,450 B1 | * | 1/2004 | Franson ......................... 385/122 |
| 7,251,769 B2 | | 7/2007 | Ashikhmin et al. |
| 7,373,581 B2 | | 5/2008 | Okamura et al. |
| 7,519,898 B2 | | 4/2009 | Narayanan et al. |
| 7,583,438 B2 | | 9/2009 | Tomita |
| 7,676,734 B2 | | 3/2010 | Yamagishi |
| 7,732,804 B2 | | 6/2010 | Hollenberg et al. |
| 7,751,491 B2 | | 7/2010 | Li et al. |
| 7,793,201 B1 | | 9/2010 | Ulriksson |
| 7,805,654 B2 | | 9/2010 | Seki |

(Continued)

FOREIGN PATENT DOCUMENTS

WO WO2014113226 A1 7/2014

OTHER PUBLICATIONS

Ruffer, B. S., et al., "On robust stability of the belief propagation algorithm for LDPC decoding," In Proc. 19th Int. Symp. Study of Mathematical Theory of Networks and Systems, 2010 [4], pp. 1-6.

(Continued)

*Primary Examiner* — Esaw Abraham
(74) *Attorney, Agent, or Firm* — Mendelsohn, Drucker & Dunleavy, P.C.; Yuri Gruzdkov (57) ABSTRACT

A memory system comprising a qubit array configured to store therein and read one or more entangled qubit states encoded using a quantum stabilizer code. The quantum-memory system further comprises a quantum-state-refresh module configured to change an entangled qubit state in the qubit array when an error is detected therein. The quantum-state-refresh module is configured to detect an error by performing a redundant measurement of a set of syndrome values corresponding to the quantum stabilizer code, with the redundant measurement being based on a block error-correction code. In one embodiment, the block error-correction code is a low-density generator-matrix code or a low-density parity-check code constructed using an EXIT-function optimization method.

18 Claims, 7 Drawing Sheets

(56) References Cited

U.S. PATENT DOCUMENTS

| | | | |
|---|---|---|---|
| 7,875,876 | B1 | 1/2011 | Wandzura et al. |
| 7,966,549 | B2 * | 6/2011 | Hollenberg et al. .......... 714/776 |
| 8,223,414 | B2 | 7/2012 | Goto et al. |
| 8,327,215 | B2 | 12/2012 | Yoon et al. |
| 8,510,618 | B1 * | 8/2013 | Pesetski et al. ............... 714/746 |
| 2004/0000666 | A1 | 1/2004 | Lidar et al. |
| 2006/0101236 | A1 | 5/2006 | Han |
| 2007/0126436 | A1 | 6/2007 | Hannah |
| 2008/0185576 | A1 | 8/2008 | Hollenberg et al. |
| 2008/0237579 | A1 | 10/2008 | Barker et al. |
| 2009/0213444 | A1 | 8/2009 | Goto et al. |
| 2010/0251049 | A1 | 9/2010 | Goto et al. |
| 2013/0088224 | A1 | 4/2013 | Koizumi |
| 2013/0107617 | A1 | 5/2013 | Skold et al. |
| 2014/0201591 | A1 | 7/2014 | Ashikhmin |

OTHER PUBLICATIONS

Ezhov, A. A., et al., "Quantum associative memory with distributed queries, Information Sciences," vol. 128, Issues 3-4, Oct. 1, 2000, pp. 271-293, Retrieved from: (http://www.sciencedirect.com/science/article/pii/S0020025500000578).

Steane, A. M., et al., "Error Correcting codes in Quantum Theory", APS Journals, Physical Review Letter, vol. 77, No. 5, pp. 793-797 (1996).

DiVincenzo, D. P., et al., "Fault-Tolerant Error Correction with Efficient Quantum Codes," APS Journals, Physical Review Letter, vol. 77, No. 15, pp. 3260-3263.

Barenco, A., et al., "Elementary gates for quantum computation," APS Journals, A Physical Review, vol. 52, No. 5., Nov. 1995, pp. 3457-3467.

Preskill, J., "Reliable Quantum Computer," Proceeding from Royal Society, London, 1998, vol. 454, pp. 385-410.

Muthukrishnan, A., "Classical and Quantum Logic Gates: An Introduction to Quantum Computing," Quantum Information Seminar, Rochester Center for Quantum Information, Sep. 1999, pp. 1-22.

Kielpinski, D., "A Small Trapped-Ion Quantum Register," Institute of Physics Publishing, Journal of Optics B: Quantum and Semiclassical Optics, vol. 5, 2003, R121-R135.

Van Meter, R. D., III, "Architecture of a Quantum Multicomputer Optimized for Shor',s Factoring Algorithm," PhD dissertation, Keio Univ., 2006, pp. i-239.

Kok, P., et al., "Linear Optical Quantum Computing with Photonic Qubits," APS Journals, Reviews of Modern Physics, vol. 79, No. 1, pp. 135-174 (2007).

Li, R., et al., "Robust High-Fidelity Universal Set of Quantum Gates Through Non-Adiabatic Rapid Passage," Journal of Modern Optics, vol. 00, No. 00, Jan. 2010, pp. 1-8.

Valiron, B., "Quantum computation: a tutorial," New Generation Computing, 2012, pp. 1-30.

Wootton, J. R., "Quantum Memories and Error Correction," Tutorial Review, Journal of Modern Optics, vol. 59, No. 20, Nov. 2012, pp. 1717-1738.

"Quantum Error Correction," Chapter 7, http://www.theory.caltech.edu/people/preskill/ph2291, 1999 [Retrieved on May 28, 2013]. Retrieved from the Internet: <URL:http://www.theory.caltech.edu/people/preskill/ph229/notes/chap7.pdf> (92 pages).

Liu, K., et al., "Optimization of LDGM-based quantum codes using Density Evolution," 48th Allerton Annual Conference on Communication, Control, and Computing, Illinois (US), 2010, IEEE, Sep. 29, 2010, pp. 881-886.

International Search Report and Written Opinion; Mailed Sep. 29, 2014 for corresponding PCT Application No. PCT/US2014/041216.

Decoding methods—Wikipedia, the free encyclopedia, http://en.wikipedia.org/wiki/Decoding_methods, May 1, 2012, 5 pgs.

Quantum computer—Wikipedia, the free encyclopedia, http://en.wikipedia.org/wiki/Quantum_computer, Jan. 11, 2013, 24 pgs.

Quantum error correction—Wikipedia, the free encyclopedia, http://en.wikipedia.org/wiki/Quantum_error_correction, Nov. 20, 2012, 6 pgs.

Quantum gate—Wikipedia, the free encyclopedia, http://en.wikipedia.org/wiki/Quantum_gate, Jan. 13, 2013, 7 pgs.

Stabilizer code—Wikipedia, the free encyclopedia, http://en.wikipedia.org/wiki/Stabilizer_code, Nov. 26, 2012, 5 pgs.

Gaitan, Frank, Quantum Error Correction and Fault Tolerant Quantum Computing, CRC Press, 2008, Florida, pp. vii-292.

Nielsen, Michael A. et al., Quantum Computation and Quantum Information, Cambridge University Press, 2000, UK, pp. vii-676.

Gottesman, D. "An introduction to quantum error correction and fault-tolerant quantum computation." Quantum Information Science and Its Contributions to Mathematics 68 (2010): 13-60.

Rieffel, E., et al., "An introduction to quantum computing for non-physicists." ACM Computing surveys 32.3 (2000): 300-335.

Gilbert, G., & Weinstein, Y. S., "Logical zeros for the seven-qubit quantum error correction code," In SPIE Defense, Security, and Sensing, 2011, May, (pp. 80570D-80570D). International Society for Optics and Photonics.

Nielsen, M. A., et al. "Quantum computation and quantum information." Cambridge university press, 2010.

* cited by examiner

ERROR CORRECTION FOR ENTANGLED QUANTUM STATES

The U.S. Government has a paid-up license in this invention and the right in limited circumstances to require the patent owner to license to others on reasonable terms as provided for by the terms of Contract No. D11PC20165 awarded by the Intelligence Advanced Research Projects Activity (IARPA).

BACKGROUND

1. Field

The present disclosure relates to error correction that can be used, e.g., in a memory system, and, more specifically but not exclusively, to error correction in hardware processing.

2. Description of the Related Art

This section introduces aspects that may help facilitate a better understanding of the invention(s). Accordingly, the statements of this section are to be read in this light and are not to be understood as admissions about what is in the prior art or what is not in the prior art.

A quantum memory is a device that is configured to store and read a quantum state. Such a device can be based on, e.g., quantum dots, rare-earth ions in a solid, nitrogen-vacancy centers in diamond, trapped ions, optical pulses with a low photon count, fractional quantum Hall liquids, or any other suitable quantum-mechanical system. Some applications rely on a quantum memory to store quantum states with sufficiently high fidelity for a relatively long time. However, the quantum state or ensemble of quantum states may exhibit a relatively high rate of loss of fidelity, e.g., due to decoherence and/or processing in quantum-gate devices.

SUMMARY OF SOME SPECIFIC EMBODIMENTS

Disclosed herein are various embodiments of a memory system comprising a qubit array configured to store therein and read one or more entangled qubit states encoded using a quantum stabilizer code. The quantum-memory system further comprises a quantum-state-refresh module configured to change an entangled qubit state in the qubit array when an error is detected therein. The quantum-state-refresh module is configured to detect an error by performing a redundant measurement of a set of syndrome values corresponding to the quantum stabilizer code, with the redundant measurement being based on a block error-correction code. In one embodiment, the block error-correction code is a low-density generator-matrix code or a low-density parity-check code constructed using an EXIT-function analysis of the corresponding bipartite graph.

According to one embodiment, provided is an apparatus comprising: a register (e.g., 134) configured to store a coded entangled qubit state generated using a quantum stabilizer code (e.g., Q); a measurement circuit (e.g., 140, 200) configured to perform a redundant measurement of a set of syndrome values corresponding to the coded entangled qubit state, wherein the redundant measurement is performed based on a low-density parity-check (LDPC) error-correction code (e.g., C); and a decoder (e.g., 138) configured to apply the LDPC error-correction code to correct a measurement error in the set of syndrome values.

In some embodiments of the above apparatus, the LDPC error-correction code is a low-density generator-matrix code.

In some embodiments of any of the above apparatus, the coded entangled qubit state is generated using the quantum stabilizer code that is a different LDPC code compared to the LDPC code used for the redundant measurement.

In some embodiments of any of the above apparatus, the LDPC error-correction code has a sparse parity-bit generator sub-matrix (e.g., P).

In some embodiments of any of the above apparatus, the parity-bit generator sub-matrix has a density that is smaller than about 10%.

In some embodiments of any of the above apparatus, the parity-bit generator sub-matrix has a density that is between about 5% and about 25%.

In some embodiments of any of the above apparatus, all rows in a transposed parity-bit generator sub-matrix (e.g., $P^T$) of the LDPC error-correction code have a same constant weight (e.g., m).

In some embodiments of any of the above apparatus, the transposed parity-bit generator sub-matrix has a column-weight distribution that causes EXIT functions corresponding to variable and check nodes of a bipartite graph of the LDPC error-correction code not to intersect.

In some embodiments of any of the above apparatus, the apparatus further comprises a state-recovery circuit (e.g., 148) configured to correct an error in the coded entangled qubit state based on a syndrome value received from the decoder.

In some embodiments of any of the above apparatus, the state-recovery circuit is further configured to: determine, based on a corrected set of syndrome values, an error operator (e.g., E) corresponding to a probable error in the coded entangled qubit state; and process the coded entangled qubit state based on the error operator in a manner that corrects the probable error therein.

In some embodiments of any of the above apparatus, the apparatus further comprises an array (e.g., 110) for storing a plurality of coded entangled qubit states, wherein the apparatus is configured to: transfer a selected coded entangled qubit state from the array to the register; and transfer the selected coded entangled qubit state from the register to the array in response to modifying the selected entangled qubit state based on the error operator.

In some embodiments of any of the above apparatus, the measurement circuit comprises: a first set of measurement modules (e.g., $210_1$-$210_4$) coupled to the register, wherein each measurement module is configured to measure a respective syndrome value (e.g., one of $s_1, \ldots, s_r$) of the coded entangled qubit state based on a respective one of first binary vectors; a second set of measurement modules (e.g., $210_5$-$210_{12}$) coupled to the register, wherein each measurement module is configured to measure a respective parity value (e.g., one of $p_1, \ldots, p_{N-r}$) of the coded entangled qubit state based on a respective one of second binary vectors (e.g., $f_j$), wherein each parity value is related to some of the syndrome values as defined by the LDPC error-correction code (e.g., Eq. (5)).

In some embodiments of any of the above apparatus, the measurement module in the first set comprises a respective soft-output detector (e.g., 212) configured to generate the respective syndrome value as a log-likelihood-ratio (LLR) value; and the measurement module in the second set comprises a respective soft-output detector (e.g., 212) configured to generate the respective parity value as an LLR value.

In some embodiments of any of the above apparatus, the decoder is configured to correct the measurement error by executing a message-passing decoding algorithm (e.g., 400) corresponding to the LDPC error-correction code.

In some embodiments of any of the above apparatus, said message-passing decoding algorithm is initialized using the LLR values generated by the measurement modules (e.g., as in 402).

In some embodiments of any of the above apparatus, a measurement module in the measurement circuit comprises: a sequence of quantum gates (e.g., M, H) connected to the register and configured to process a reference multi-qubit state by coupling the coded entangled qubit state to the reference multi-qubit state; and a logic circuit (e.g., 212) configured to estimate a syndrome value or a parity value of the coded entangled qubit state from measurements on the processed reference multi-qubit state performed by the sequence of quantum gates.

In some embodiments of any of the above apparatus, the logic circuit is configured to: estimate a respective binary syndrome sub-value or a respective binary parity sub-value from a measurement on individual qubits of the processed reference multi-qubit state; and the circuit comprises a multi-input XOR gate configured to process said binary sub-values to estimate the syndrome value or the parity value.

In some embodiments of any of the above apparatus, the logic circuit comprises a soft-output detector configured to generate a soft estimate of the syndrome value or of the parity value.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

U.S. Provisional Patent Application No. 61/752,646, filed on Jan. 15, 2013, is incorporated herein by reference in its entirety.

Figure 1:
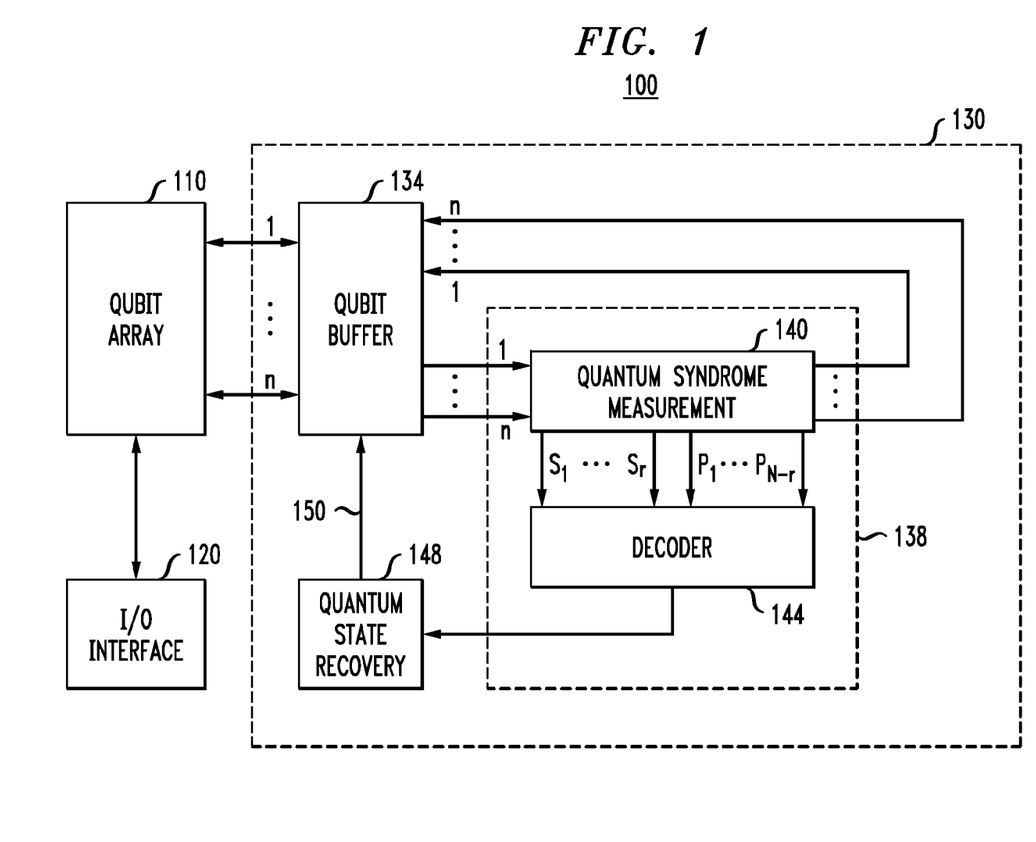
FIG. 1 shows a block diagram of a memory system according to an embodiment of the disclosure.

FIG. 1 shows a block diagram of a memory system 100 according to an embodiment of the disclosure. Memory system 100 comprises a qubit array 110 configured to store therein one or more quantum states. The quantum states can be written into and read out of qubit array 110 via an input/output (I/O) interface 120. Memory system 100 further comprises a qubit-state-refresh (QSR) module 130 that operates to effectively protect the quantum states stored in qubit array 110 from accumulating errors, thereby enabling memory system 100 to store quantum states with relatively high fidelity for a relatively long time.

As used herein, the term "qubit" refers to a memory element or cell that comprises a two-state quantum-mechanical system. Examples of suitable two-state quantum-mechanical systems include, but are not limited to: (i) two spin states of a particle having a spin of ½; (ii) the ground and excited states of an atom; (iii) two polarization states of a single photon, and (iv) edge states of a FQHE (fractional quantum Hall effect) liquid droplet. Various additional embodiments of a qubit that can be used to implement qubit array 110 are disclosed, e.g., in U.S. Pat. No. 7,732,804 and U.S. Patent Application Publication Nos. 2004/0000666 and 2013/0107617, all of which are incorporated herein by reference in their entirety.

The two states with respect to which the state of a qubit can be measured are referred to as the basis states. A non-entangled qubit state is a linear superposition of the basis states. Multi-qubit states differ from classical multi-bit states in that the former can be formed to exhibit entanglement. An entangled qubit state cannot be decomposed into a simple product of single-qubit basis states, but rather, it can be expressed as a linear combination or superposition of different products of single-qubit basis states. QSR module 130 is configured to use the entangled nature of a multi-qubit state, e.g., as further detailed below, to effectively protect qubit array 110 from accumulating errors in the qubit states therein.

According to some embodiments, each entangled qubit state stored in qubit array 110 is encoded using a quantum stabilizer code, Q. A quantum stabilizer code Q of length n and dimension k operates on a linear subspace of dimension $2^k$ in the complex space $S^D$, where $D=2_n$. One representation of the quantum stabilizer code Q is a group G of cardinality $|G|=2^r$ (where $r=n-k$). The group has r generators, wherein each generator is a binary vector $g=(g_1, g_2, \ldots, g_{2n-1}, g_{2n})$ of 2n bits each. Herein, the 2n bits of such a binary vector are grouped into n pairs of bits. Any two vectors g from group G satisfy the following constraint:

if $g, g' \in G$, then $g*g'=0$, where the "*" sign denotes the symplectic inner product of binary vectors g and g', which mixes the corresponding bit pairs of vectors g and g'. For example, the following four binary vectors may represent a quantum stabilizer code Q of length n=5 and dimension k=1:

$g_1$=(10 01 01 10 00)

$g_2$=(10 00 10 01 01)

$g_3$=(00 10 01 01 10)

$g_4$=(01 10 00 10 01)            (1)

The weight of vector g, denoted wt(g), is the number of nonzero bit pairs $g_{2t-1}, g_{2t}$ therein, where $t=1, \ldots, n$. In particular, such a pair of bits $(g_{2t-1}, g_{2t})$ is nonzero as long as at least one of $g_{2t-1}$ and $g_{2t}$ is nonzero $wt(g)=|\{g_{2t-1}, g_{2t} \neq (0,0), t=1, \ldots, n\}|$            (2)

where |x| denotes the cardinality of set x. For example, the weight of vector $g_1$ defined by Eqs. (1) is four (i.e., $wt(g_1)=4$) because only one of the five bit pairs in $g_1$ is 00.

Vector g is referred to as a "sparse" vector if its weight wt(g) is small (e.g., <10%) compared to the vector's length n. For example, vector g=(00 00 00 00 00 00 00 11 00 00 00 00 00 00 00 00 00 01 00 00 00 00 00 00 00 00 01 00 00 00 00 00 00) is sparse because its weigh wt(g) (=3) is much smaller than its length n (=33). If group G consists of r sparse vectors $g_1, g_2, \ldots, g_r$, then group G represents a quantum LDPC (low-density parity-check) code. In some embodiments, memory system 100 is configured to store, read, and write entangled quantum states that have been generated using a quantum LDPC code.

In operation, QSR module 130 is configured to serially subject to processing the different entangled quantum states stored in qubit array 110. The sets of qubits corresponding to different entangled quantum states may be transferred to QSR module 130, one set at a time, based on a preset schedule, e.g., in a round-robin sequence. QSR module 130 is further configured to subject each received set of qubits to error-correction processing, e.g., as further described below.

In one embodiment, the error-correction processing in QSR module 130 performs the steps of: (i) determining whether or not the received set of qubits corresponding to an entangled quantum state has an error, and (ii) if an error is detected, then changing the qubit state to correct the detected error. The set of qubits, now in a changed and presumably error-free entangled quantum state, is transferred back to qubit array 110. If QSR module 130 does not detect an error in the qubit state, then the corresponding entangled quantum state is presumed to be error-free, and the qubit set can be transferred back to qubit array 110 without changes to the qubit state.

In one embodiment, QSR module 130 comprises a qubit buffer 134, an error-detection circuit 138, and a quantum-state recovery circuit 148 interconnected as indicated in FIG. 1. Qubit buffer 134 comprises one or more qubit registers configured to hold the received qubits for the duration of the corresponding error-correction processing. Error-detection circuit 138 is configured to implement the above-specified step (i) of the error-correction processing. Quantum-state recovery circuit 148 is configured to act on the entangled quantum state in qubit buffer 134 to implement the above-specified step (ii) of the error-correction processing.

In one embodiment, error-detection circuit 138 includes a syndrome-measurement circuit 140 and a decoder 144 coupled to each other and to other circuits in QSR module 130 as indicated in FIG. 1.

Syndrome-measurement circuit 140 is a quantum circuit configured to perform a redundant measurement, on the encoded entangled quantum state in qubit buffer 134, of a set of syndrome values. The encoded entangled quantum state under measurement has been initially generated using the quantum stabilizer code Q. The result of this measurement is a binary vector $v=(s_1, \ldots, s_r, p_1, \ldots, p_{N-r})$ comprising N binary values. The first r binary values $(s_1, \ldots, s_r)$ in vector v carry the syndrome bits, e.g., syndrome values, corresponding to the quantum stabilizer code Q. The next N−r binary values $(p_1, \ldots, p_{N-r})$ in vector v carry the parity bits that aid to guard against possible errors in the measurement of the syndrome bits. As already indicated above, quantum gates in quantum circuits, such as syndrome-measurement circuit 140, have a relatively high inherent level of errors, which causes the probability of an erroneous syndrome measurement to be correspondingly relatively high. Hence, syndrome-measurement circuit 140 is configured to perform redundant measurements in accordance with a block error-correction code C. For this purpose, syndrome-measurement circuit 140 includes quantum circuitry that causes the generated binary vector v to be a codeword of the block error-correction code C when all of binary values $s_1, \ldots, s_r, p_1, \ldots, p_{N-r}$ are measured accurately. Representative examples of such quantum circuitry according to an embodiment of the disclosure are described in more detail below in reference to FIGS. 2A-2C.

If vector v generated by syndrome-measurement circuit 140 is a codeword of block error-correction code C, then decoder 144 truncates vector v to remove the parity values $p_1, \ldots, p_{N-r}$ and passes the measured syndrome values $s_1, \ldots, s_r$ to quantum-state recovery circuit 148.

If the vector v generated by syndrome-measurement circuit 140 is determined to not be a valid codeword of block error-correction code C, then the binary values $s_1, \ldots, s_r, p_1, \ldots, p_{N-r}$ are processed as not having been measured accurately. In this case, decoder 144 is configured to process the measured vector v in accordance with the block error-correction code C to determine the most probable valid codeword corresponding to the measured vector v. Representative examples of such processing according to an embodiment of the disclosure are described in more detail below in reference to FIGS. 3 and 4. Additional examples of such processing according to various alternative embodiments are disclosed in U.S. patent application Ser. No. 13/912,876, by Alexei Ashikhmin, filed on the same date as the present application, and entitled "SYNDROME OF DEGRADED QUANTUM REDUNDANCY CODED STATES," which is incorporated herein by reference in its entirety. After such processing, decoder 144 truncates the determined most probable codeword and passes the corresponding most probable syndrome values $s_1, \ldots, s_r$ to quantum-state recovery circuit 148.

Quantum-state recovery circuit 148 uses the syndrome values $s_1, \ldots, s_r$ received from decoder 144 to correct an error (if any) in the entangled quantum state stored in qubit buffer 134. More specifically, if the syndrome values $s_1, \ldots, s_r$ received from decoder 144 are all zeros, then the entangled quantum state in qubit buffer 134 is presumed to be error-free, and no error correction is performed on it by quantum-state recovery circuit 148. However, if any of the syndrome values $s_1, \ldots, s_r$ received from decoder 144 is not a zero, then the entangled quantum state in qubit buffer 134 is presumed to have an error. In this case, quantum-state recovery circuit 148 uses the syndrome values $s_1, \ldots, s_r$ received from decoder 144 to determine the most probable error operator E that has caused the corresponding original entangled quantum state to transform into the entangled quantum state that returned these syndrome values. The book by Frank Gaitan, entitled "Quantum Error Correction and Fault Tolerant Quantum Computing," Taylor & Francis, 2008, discloses suitable algorithms that can be used for this determination in quantum-state recovery circuit 148 according to an embodiment of the disclosure. This book by Frank Gaitan is incorporated herein by reference in its entirety. In alternative embodiments, other suitable algorithms for the determination of error operator E based on syndrome values $s_1, \ldots, s_r$ of quantum stabilizer code Q can also be used.

In one embodiment, error operator E may be represented as a square complex-valued matrix. To correct the error corresponding to error operator E, quantum-state recovery circuit 148 is first configured to find an inverse of error operator E, e.g., using a suitable conventional matrix-inversion algorithm. The resulting inverted matrix is denoted $E^{-1}$. Based on $E^{-1}$, quantum-state recovery circuit 148 is then configured to generate a stimulus 150 that changes the entangled quantum state held in qubit buffer 134 in a manner that corrects the error caused by error operator E. If the error correction is performed properly, then the corrected entangled quantum state in qubit buffer 134 will most probably have an all-zero syndrome.

For illustration purposes and without any implied limitation, the subsequent description of some embodiments is given with reference to an example of block error-correction code C having the following generator matrix G(C):

$$G(C) = \begin{bmatrix} 1 & 0 & 0 & 0 & 1 & 0 & 1 & 1 & 1 & 0 & 1 & 0 \\ 0 & 1 & 0 & 0 & 0 & 1 & 1 & 1 & 0 & 0 & 1 & 1 \\ 0 & 0 & 1 & 0 & 1 & 1 & 0 & 0 & 1 & 1 & 1 & 0 \\ 0 & 0 & 0 & 1 & 0 & 0 & 0 & 1 & 1 & 1 & 1 & 1 \end{bmatrix} \quad (3)$$

This block error-correction code is a code example for which r=4 and N=12. An embodiment of syndrome-measurement circuit 140 corresponding to this block error-correction code C operates to generate a vector $v=(s_1, \ldots, s_4, p_1, \ldots, p_8)$.

Note that generator matrix G(C), as given by Eq. (3), has the form of $G(C)=[I_4|P]$, where $I_4$ is a 4×4 identity matrix, and P is an r×(N−r) binary matrix corresponding to block error-correction code C. Matrix P is hereafter referred to as the parity-bit generator sub-matrix. The parity-check matrix, H(C), corresponding to this form of generator matrix G(C) has the form of $H(C)=[P^T|I_{N-r}]$, where $I_{N-r}$ is an (N−r)×(N−r) identity matrix, and $P^T$ is P transposed. The parity-check matrix H(C) corresponding to the generator matrix G(C) given by Eq. (3) is given by Eq. (4):

$$H(C) = \begin{bmatrix} 1 & 0 & 1 & 0 & 1 & 0 & 0 & 0 & 0 & 0 & 0 \\ 0 & 1 & 1 & 0 & 0 & 1 & 0 & 0 & 0 & 0 & 0 \\ 1 & 1 & 0 & 0 & 0 & 0 & 1 & 0 & 0 & 0 & 0 \\ 1 & 1 & 0 & 1 & 0 & 0 & 0 & 1 & 0 & 0 & 0 \\ 1 & 0 & 1 & 1 & 0 & 0 & 0 & 0 & 1 & 0 & 0 \\ 0 & 0 & 1 & 1 & 0 & 0 & 0 & 0 & 0 & 1 & 0 \\ 1 & 1 & 1 & 1 & 0 & 0 & 0 & 0 & 0 & 1 & 0 \\ 0 & 1 & 0 & 1 & 0 & 0 & 0 & 0 & 0 & 0 & 1 \end{bmatrix} \quad (4)$$

This parity-check matrix H(C) causes the parity bits $p_1, \ldots, p_8$ of vector v generated by syndrome-measurement circuit 140 to have the following relationship with the syndrome bits $s_1, \ldots, s_4$:

$p_1 = s_1 + s_3$ $p_2 = s_2 + s_3$ $p_3 = s_1 + s_2$ $p_4 = s_1 + s_2 + s_4$ $p_5 = s_1 + s_3 + s_4$ $p_6 = s_3 + s_4$ $p_7 = s_1 + s_2 + s_3 + s_4$ $p_8 = s_2 + s_4$ \quad (5)

Note that all summations in Eqs. (5) are performed by modulo 2.

Figure 2A:
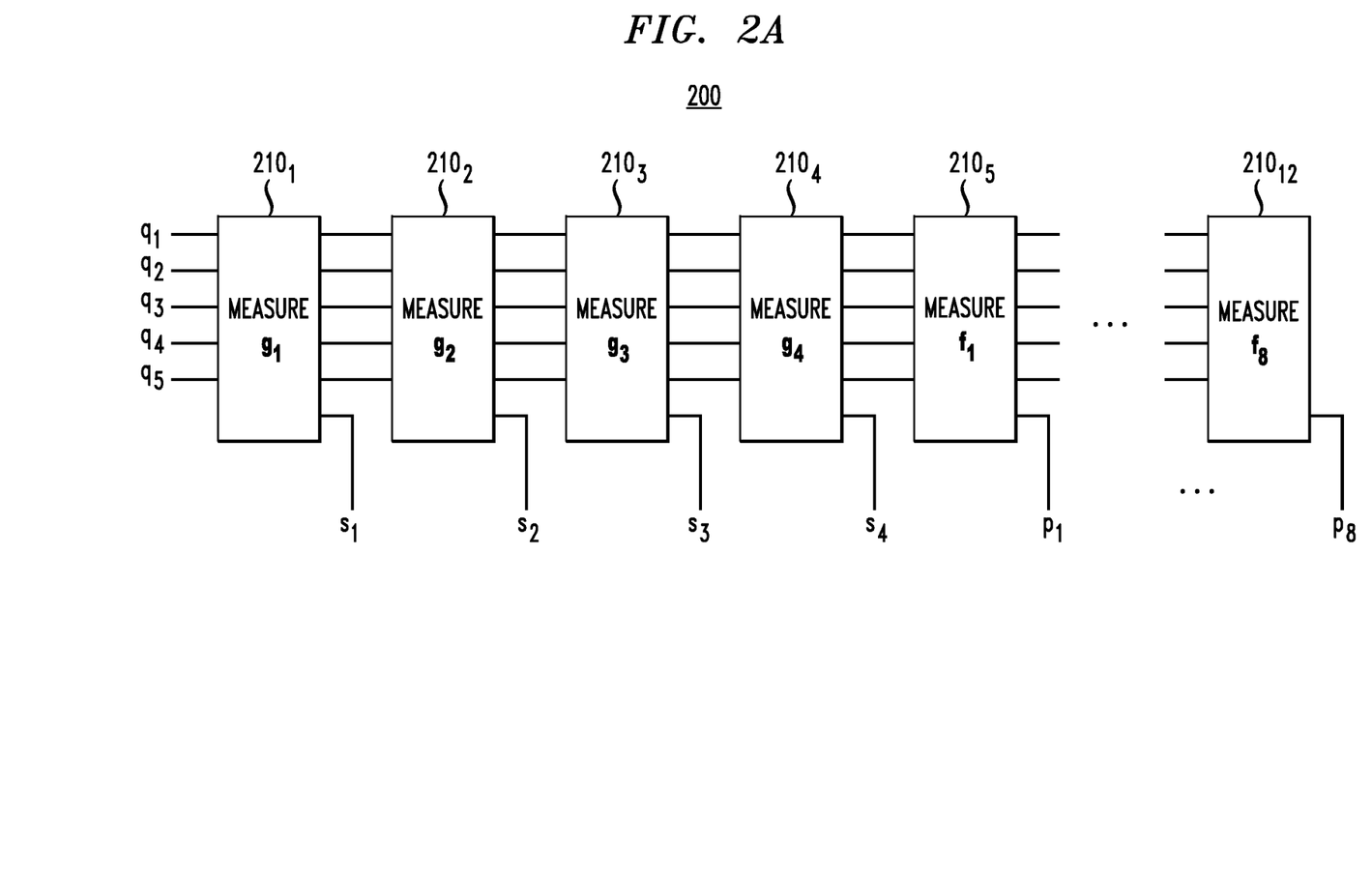
FIGS. 2A-2C show block diagrams of a syndrome-measurement circuit that can be used in the memory system of FIG. 1 according to an embodiment of the disclosure.
Figure 2B:
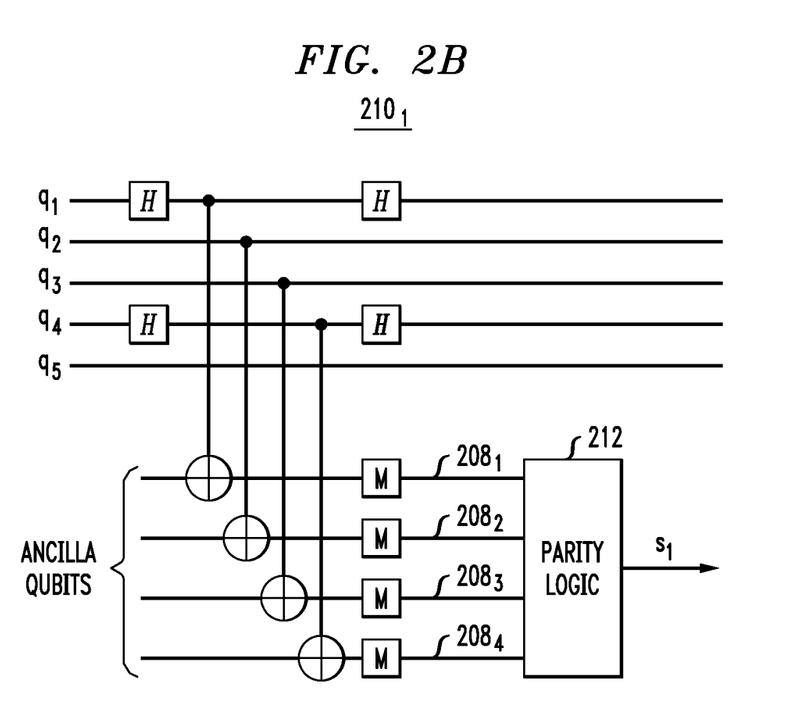
Figure 2C:
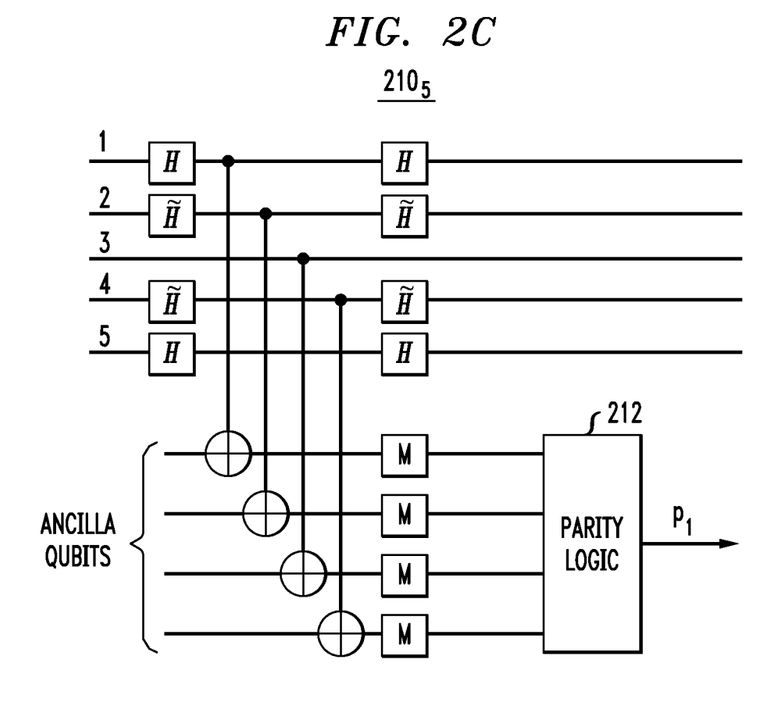

FIGS. 2A-2C show block diagrams of a syndrome-measurement circuit 200 that can be used as syndrome-measurement circuit 140 (FIG. 1) according to an embodiment of the disclosure. More specifically, FIG. 2A shows an overall block diagram of syndrome-measurement circuit 200. FIG. 2B shows a block diagram of a module $210_1$ in circuit 200 configured to measure the value of syndrome bit $s_1$. FIG. 2C shows a block diagram of a module $210_5$ in circuit 200 configured to measure the value of parity bit $p_1$. Based on the block diagrams shown in FIGS. 2B and 2C and the corresponding description provided below, one of ordinary skill in the art will be able to construct block diagrams for each of the remaining ten modules 210 in circuit 200. Syndrome-measurement circuit 200 is designed to perform measurements in accordance with the block error-correction code C having the generator matrix G(C) given by Eq. (3).

Referring to FIG. 2A, syndrome-measurement circuit 200 is configured to perform a syndrome measurement for an entangled quantum state encoded in qubits $q_1$-$q_5$. This measurement is performed by generating vector $v=(s_1, \ldots, s_4, p_1, \ldots, p_8)$. Each component of vector v is generated by a corresponding one of measurement modules $210_1$-$210_{12}$, wherein measurement modules $210_1$-$210_4$ are configured to generate vector components $s_1$-$s_4$, respectively, and measurement modules $210_5$-$210_{12}$ are configured to generate vector components $p_1$-$p_8$, respectively.

Each of measurement modules $210_1$-$210_4$ is configured to generate a respective one of syndrome values $s_1$-$s_4$ by performing a measurement on the entangled quantum state of qubits $q_1$-$q_5$, which measurement is based on a respective one of the binary vectors g representing quantum stabilizer code Q. For the embodiment shown in FIGS. 2A-2C, these binary vectors are vectors $g_1$-$g_4$ given by Eqs. (1). Each of measurement modules $210_5$-$210_{12}$ is configured to generate a respective one of parity values $p_1$-$p_8$ by performing a measurement on the entangled quantum state of qubits $q_1$-$q_5$, which measurement is based on a respective one of binary vectors $f_1$-$f_8$. The binary vectors $f_1$-$f_8$ are generated, based on the parity checks implemented in block error-correction code C as the corresponding linear combinations of the binary vectors g representing quantum stabilizer code Q. For example, for the block error-correction code C having the generator matrix G(C) given by Eq. (3), binary vectors $f_1$-$f_8$ are expressed by Eqs. (6) as follows:

$f_1 = g_1 + g_3$ $f_2 = g_2 + g_3$ $f_3 = g_1 + g_2$ $f_4 = g_1 + g_2 + g_4$ $f_5 = g_1 + g_3 + g_4$ $f_6 = g_3 + g_4$ $f_7 = g_1 + g_2 + g_3 + g_4$ $f_8 = g_2 + g_4$ \quad (6)

Also note the similarity between Eqs. (5) and (6).

FIG. 2B shows a block diagram of measurement module $210_1$ according to an embodiment of the disclosure. Measurement module $210_1$ is an example of a measurement module configured to generate a syndrome value for vector v. More specifically, measurement module $210_1$ is configured to measure a state formed by coupling the entangled quantum state of qubits $q_1$-$q_5$ to a reference state of ancilla qubits based on a coupling defined by the binary vector $g_1$=(10 01 01 10 00) of the above-described quantum stabilizer code Q (see Eqs. (1)). The ancilla qubits are reference qubits that are prepared, as known in the art, to be in a particular preselected quantum state.

Measurement module $210_1$ comprises four quantum Hadamard gates H or H̃, four quantum CNOT gates (+), and four quantum measurement gates M, all arranged as shown in FIG. 2B. One of ordinary skill in the art will recognize that quantum Hadamard gates, quantum CNOT gates, and quantum measurement gates are elementary quantum gates from the universal quantum-gate set, which is conventionally used in the construction of quantum circuits. Descriptions of such elementary quantum gates can be found, e.g., in (i) A. Barenco, et al., "Elementary Gates for Quantum Computation," Physical Review A, 1995, v. 52, pp. 3457-3467; (ii) the book by Goong Chen, et al., "QUANTUM COMPUTING DEVICES: PRINCIPLES, DESIGNS, AND ANALYSIS," CRC Press, 2007; and (iii) the book by M. Nielsen and I. Chuang, "Quantum Computation and Quantum Information," Cambridge University Press, 2000, all of which are incorporated herein by reference in their entirety. Additional description of quantum Hadamard gates and quantum CNOT gates can be found, e.g., in the above-cited book by Frank Gaitan and the above-cited U.S. patent application Ser. No. 13/912,876 by Alexei Ashikhmin.

The first bit pair in $g_1$ is 10. Accordingly, measurement module $210_1$ is configured to couple qubit $q_1$ and an ancilla qubit via a Hadamard gate and a CNOT gate. The second bit pair in $g_1$ is 01. Accordingly, measurement module $210_1$ is configured to couple qubit $q_2$ and an ancilla qubit via a CNOT gate, while no Hadamard gate is used. The third bit pair in $g_1$ is again 01. Accordingly, measurement module $210_1$ is configured to couple qubit $q_3$ and an ancilla qubit in a manner similar to that of qubit $q_2$. The fourth bit pair in $g_1$ is again 01. Accordingly, measurement module $210_1$ is configured to couple qubit $q_4$ and an ancilla qubit in a manner similar to that of qubit $q_1$. The fifth bit pair in $g_1$ is 00. Accordingly, measurement module $210_1$ does not couple qubit $q_5$ and an ancilla qubit.

Each quantum measurement gate M in measurement module $210_1$ is configured to (i) measure the qubit state applied to its input port (located at the left side of the gate in FIG. 2B) and (ii) based on the measurement, generate a corresponding electrical output signal $208_i$ (i=1, 2, 3, 4) at its output port (located at the right side of the gate in FIG. 2B). Each quantum measurement gate M then applies electrical output signal $208_i$ to a parity logic circuit 212 connected to receive electrical output signals $208_1$-$208_4$.

In one embodiment, parity logic circuit 212 is configured to slice each of signals $208_1$-$208_4$, thereby converting each of them into a respective binary value (0 or 1). Parity logic circuit 212 is further configured to output (i) a binary "zero" if the number of zeros generated from signals $208_1$-$208_4$ is even, and (ii) a binary "one" if the number of zeros generated from signals $208_1$-$208_4$ is odd. In effect, the latter function of parity logic circuit 212 is the same as that of a conventional four-input exclusive-OR (XOR) gate.

In an alternative embodiment, parity logic circuit 212 includes a soft-output detector (not explicitly shown in FIG. 2B). More specifically, in this embodiment, instead of converting signals $208_1$-$208_4$ into a "hard" binary value (0 or 1) for syndrome bit $s_1$, parity logic circuit 212 uses the soft-output detector to convert signals $208_1$-$208_4$ into a log-likelihood-ratio (LLR) value representing syndrome bit $s_1$. In a possible embodiment, an LLR value comprises (i) a sign bit that represents the detector's best guess regarding the hard value of syndrome bit $s_1$ and (ii) one or more magnitude bits that represent the detector's confidence in the hard value. For example, parity logic circuit 212 may be configured to output a five-bit LLR value, where the most-significant bit is the sign bit and the four least-significant bits are the confidence bits. By way of example and without limitation, a five-bit LLR value of 00000 indicates a hard value of 0 with minimum confidence, while a five-bit LLR value of 01111 indicates a hard value of 0 with maximum confidence. Intermediate values (e.g., between 0000 and 1111) of confidence bits represent intermediate confidence levels. Similarly, a five-bit LLR value of 10001 indicates a hard value of 1 with minimum confidence, while a five-bit LLR value of 11111 indicates a hard decision of 1 with maximum confidence, wherein the binary value of 10000 is usually unused. Other numbers of bits and other representations of confidence levels may alternatively be used as well.

In one embodiment, the soft-output detector in parity logic circuit 212 is configured to generate four intermediate LLR values, each based on a respective one of signals $208_1$-$208_4$. Parity logic circuit 212 then processes these four intermediate LLR values, e.g., using a soft-input/soft-output (SISO) XOR gate, thereby converting them into the corresponding LLR value representing syndrome bit $s_1$.

In general, an intermediate LLR value generated by the soft-output detector in parity logic circuit 212 depends on the type and number of quantum gates in the corresponding qubit-measurement path. For example, the qubit-measurement path for qubit $q_1$ includes three quantum gates, i.e., a quantum Hadamard gate H, a quantum CNOT gate ⊕, and a quantum measurement gate M. As a result, the corresponding probability of an erroneous measurement corresponding to qubit $q_1$ ($P_{err}(q_1)$) can be expressed using the probabilities of errors in the three individual quantum gates within the $q_1$-measurement path, e.g., as follows:

$$P_{err}(q_1) \approx 1-(1-p_H)\times(1-p_{CNOT})\times(1-p_M) \quad (7)$$

where $p_H$, $p_{CNOT}$, $p_M$ are the probabilities of errors in the quantum Hadamard gate H, the quantum CNOT gate ⊕, and the quantum measurement gate M, respectively, in the $q_1$-measurement path. In one embodiment, the soft-output detector in parity logic circuit 212 can be configured to convert this probability of error, as known in the art, into the confidence bits of the LLR value corresponding to signal $208_1$.

As another example, the qubit-measurement path for qubit $q_2$ includes two quantum gates, i.e., a quantum CNOT gate ⊕ and a quantum measurement gate M. As a result, the corresponding probability of an erroneous measurement corresponding to qubit $q_2$ ($P_{err}(q_2)$) can be expressed using the probabilities of errors in these two individual quantum gates. The soft-output detector in parity logic circuit 212 can similarly be configured to convert this particular probability of error into the confidence bits of the LLR value corresponding to signal $208_2$.

Eq. (8) gives an approximate expression for the probability ($P_{err}(g_1)$) that measurement module $210_1$ generates an erroneous hard value of syndrome bit $s_1$:

$$P_{err}(g_1) \approx 1-(1-p_{qg})^{3wt(g1)} \quad (8)$$

where $p_{qg}$ is the average probability of error in an individual quantum gate (of any type) in measurement module $210_1$; and $wt(g_1)$ is the weight of binary vector $g_1$, i.e., the binary vector of the above-described quantum stabilizer code Q corresponding to the measurement performed in measurement module $210_1$. In one embodiment, parity logic circuit 212 can be configured to generate confidence bits of the LLR value representing syndrome bit $s_1$ based on Eq. (8), rather than based on the above-mentioned processing of intermediate LLR values in a SISO XOR gate.

FIG. 2C shows a block diagram of measurement module $210_5$ according to an embodiment of the disclosure. Measurement module $210_5$ is an example of a measurement module configured to generate a parity bit value for vector v. More specifically, measurement module $210_5$ is configured to measure a state formed by coupling the entangled quantum state of qubits $q_1$-$q_5$ to a reference state of ancilla qubits based on a coupling defined by binary vector $f_1$=(10 11 00 11 10) (see Eqs. (6)).

The first bit pair in $f_1$ is 10. Accordingly, measurement module $210_5$ is configured to couple qubit $q_1$ and an ancilla qubit via a Hadamard gate and a CNOT gate. The second bit pair in $f_1$ is 11. Accordingly, measurement module $210_5$ is configured to couple qubit $q_2$ and an ancilla qubit via a Hadamard gate $\tilde{H}$ and a CNOT gate. The third bit pair in $f_1$ is 00. Accordingly, measurement module $210_5$ does not couple qubit $q_3$ and an ancilla qubit. The fourth bit pair in $f_1$ is again 11. Accordingly, measurement module $210_5$ is configured to couple qubit $q_4$ and an ancilla qubit in a manner similar to that of qubit $q_2$. The fifth bit pair in $f_1$ is 10. Accordingly, measurement module $210_5$ is configured to couple qubit $q_5$ and an ancilla qubit in a manner similar to that of qubit $q_1$. The quantum measurement gates M and parity logic circuit 212 in measurement module $210_5$ operate similar to those in measurement module $210_1$ (FIG. 2B).

One of ordinary skill in the art will understand how to construct appropriate expressions for $P_{err}(q_k)$ (where k=1, 2, ..., 5) and $P_{err}(f_1)$ for a soft-output embodiment of parity logic circuit 212 in measurement module $210_5$, e.g., using Eqs. (7) and (8), respectively, as examples. One of ordinary skill in the art will further understand that the expressions for the probability of error corresponding to different measurement modules $210_j$ (j=1, 2, ..., 12) may also depend on the type and number of quantum gates placed on the respective qubit lines in the upstream quantum circuits. For example, the expressions for the probability of error corresponding to measurement module $210_3$ (see FIG. 2A) may depend on the type and number of quantum gates placed on the respective qubit lines in measurement modules $210_1$ and $210_2$. The expressions for the probability of error corresponding to measurement module $210_6$ (see FIG. 2A) may depend on the type and number of quantum gates placed on the respective qubit lines in measurement modules $210_1$ through $210_5$, etc.

Additional details on how to construct measurement modules $210_1$-$210_{12}$ based on the operative quantum stabilizer code Q and block error-correction code C according to various alternative embodiments can be found, e.g., in the above-cited U.S. patent application Ser. No. 13/912,876 by Alexei Ashikhmin.

Figure 3:
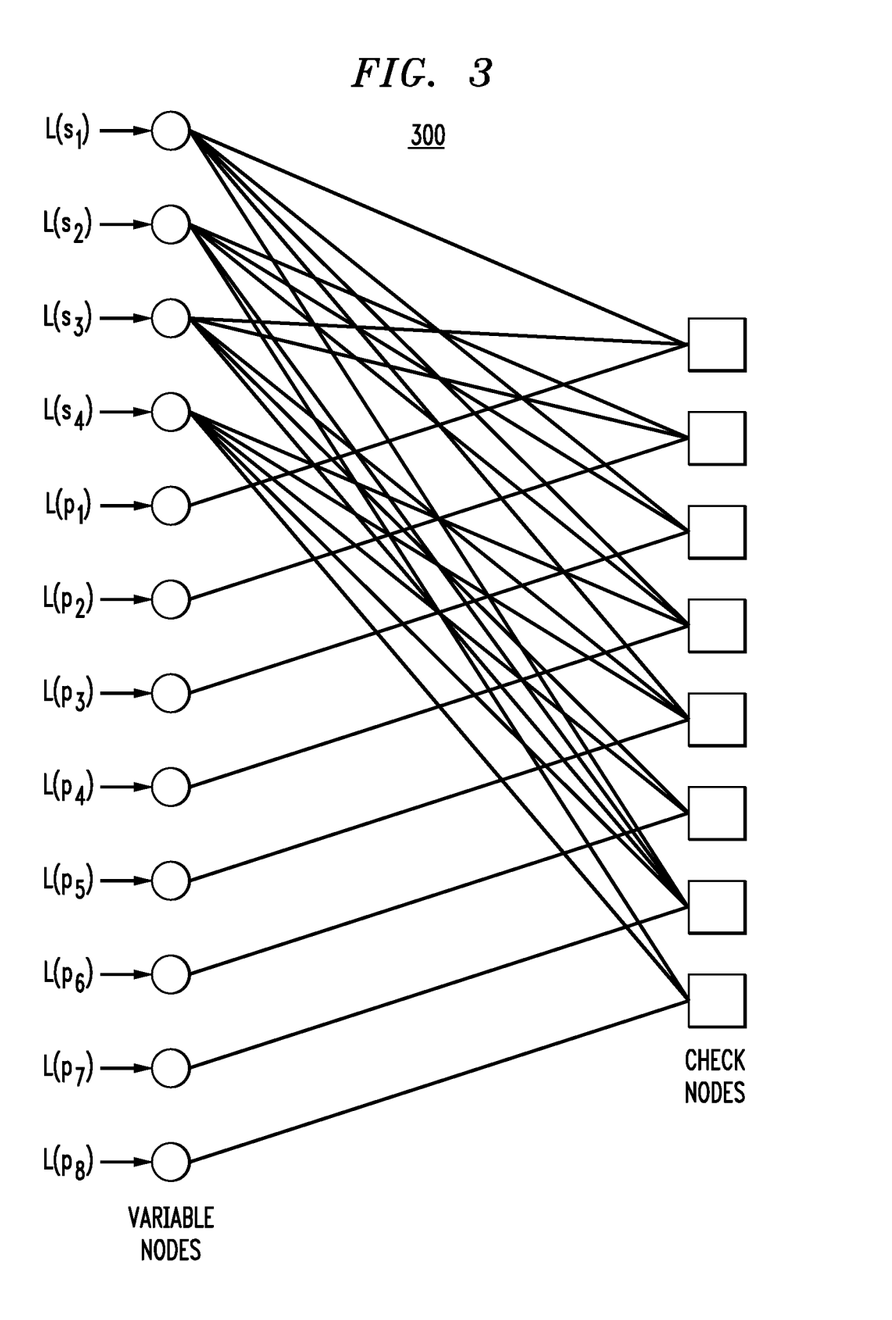
FIG. 3 shows a bipartite graph corresponding to a message-passing decoding algorithm that can be used in the memory system of FIG. 1 according to an embodiment of the disclosure.

FIG. 3 shows a bipartite graph 300 corresponding to a message-passing decoding algorithm that can be used in decoder 144 (FIG. 1) according to an embodiment of the disclosure. More specifically, bipartite graph 300 corresponds to parity-check matrix H(C) given by Eq. (4). As such, a message-passing decoding algorithm based on bipartite graph 300 can be used to correct measurement errors in vector $v=(s_1, \ldots, s_4, p_1, \ldots, p_8)$ generated by syndrome-measurement circuit 200 (FIG. 2A). Further description of bipartite graph 300 is given below in reference to FIG. 4.

Figure 4:
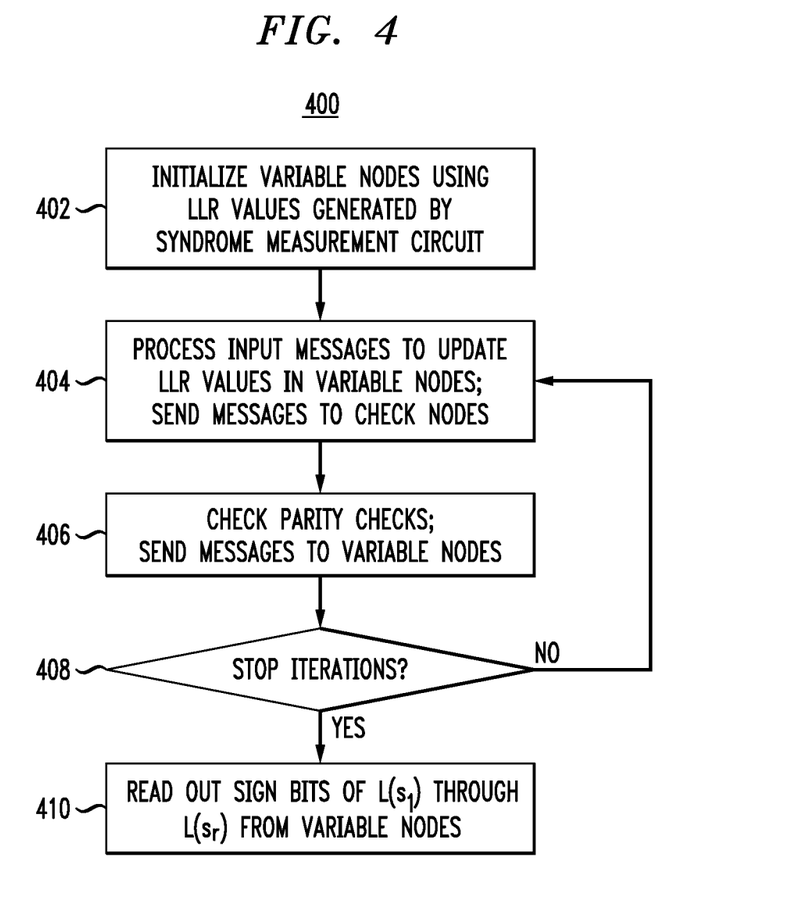
FIG. 4 shows a flowchart of a decoding method that can be used in the memory system of FIG. 1 according to an embodiment of the disclosure.

FIG. 4 illustrates a decoding method 400 that can be used in decoder 144 (FIG. 1) according to an embodiment of the disclosure. Method 400 can be used in an embodiment of decoder 144 configured to receive vector v whose components are LLR values generated, e.g., as described above, by respective parity logic circuits 212 in measurement modules $210_1$-$210_{12}$ (see FIGS. 2A-2C). Based on the provided description, one of ordinary skill in the art will understand how to modify decoding method 400 for an alternative embodiment compatible with a different block error-correction code C and/or a different quantum stabilizer code Q.

Method 400 is directed at computing the a posteriori probability that a given bit $c_i$ in codeword $c=(c_1, c_2, c_3, \ldots, c_N)$ of block error-correction code C equals 1 (or 0) based on the particular vector v received from syndrome-measurement circuit 200 (FIG. 2A). The corresponding LLR value, $L(c_i)$, is given by Eq. (9):

$$L(c_i) = \log(Pr(c_i=0|v)/Pr(c_i=1|v)) \quad (9)$$

where Pr( ) denotes the a posteriori probability for the condition in the parentheses ( ). Method 400 relies on an iterative message-passing decoding algorithm based on a bipartite graph of block error-correction code C, e.g., bipartite graph 300 (FIG. 3). According to this algorithm, the variable nodes in the bipartite graph represent processors of one type; the check nodes in the bipartite graph represent processors of another type; and the edges between the variable and check nodes represent message paths.

At step 402 of method 400, the variable nodes of the bipartite graph are initialized, e.g., as indicated in FIG. 3, by receiving the LLR values generated by syndrome-measurement circuit 144 (FIG. 1) or 200 (FIG. 2A) in the process of measuring the syndrome of an entangled quantum state held in qubit buffer 134 (FIG. 1). In one embodiment, the various LLR values for this initialization are computed based on Eqs. (10a)-(10d), e.g., as follows:

$$L(s_i) = \log((1-P_{err}(g_i))/P_{err}(g_i)), \text{ if } s'_i=0 \quad (10a)$$

$$L(s_i) = -\log((1-P_{err}(g_i))/P_{err}(g_i)), \text{ if } s'_i=1 \quad (10b)$$

$$L(p_j) = \log((1-P_{err}(f_j))/P_{err}(f_j)), \text{ if } p'_j=0 \quad (10c)$$

$$L(p_j) = -\log((1-P_{err}(f_j))/P_{err}(f_j)), \text{ if } p'_j=1 \quad (10d)$$

where i=1, 2, ..., j=1, 2, ..., N-r; $P_{err}(g_i)$ is the probability that the corresponding measurement module 210 generates an erroneous hard value $s'_i$ of syndrome bit $s_i$; and $P_{err}(f_j)$ is the probability that the corresponding measurement module 210 generates an erroneous hard value $p'_j$ of parity bit $p_j$. In various embodiments, the values of $P_{err}(g_i)$ and $P_{err}(f_j)$ can be computed, e.g., based on Eq. (7) or based on Eq. (8). Other suitable methods for computing the values of $P_{err}(g_i)$ and $P_{err}(f_j)$ can also be used.

At step 404, each processor of a variable node in the bipartite graph processes its input messages received via the corresponding message paths from the respective check nodes. Note that, in the first occurrence of step 404, when no messages are yet received from the check nodes, the initial LLR values of step 402 are used instead of the input messages. Based on the received input messages, each of the processors of the variable nodes updates the respective LLR value therein, generates output messages for the respective check nodes, and transmits these messages via the corresponding message paths in the bipartite graph. The information in the transmitted messages may include the values of $\log(Pr(c_i=0|m_i)/Pr(c_i=1|m_i))$, where $m_i$ denotes the set of input messages received by the i-th variable node. Other pertinent information may be communicated as well, as known in the art.

At step 406, each processor of a check node in the bipartite graph processes its input messages received via the corresponding message paths from the respective variable nodes. Based on the received input messages, each of the processors of the check nodes generates output messages for the respective processors of the variable nodes and transmits these messages via the corresponding message paths in the bipartite graph. The information in the transmitted messages may include the values of $\log(Pr(\text{check satisfied}|M_j)/Pr(\text{check not satisfied}|M_j))$, where $M_j$ denotes the set of input messages received by the j-th check node. Other pertinent information may be communicated as well, as known in the art.

At step 408, an iteration-stopping criterion is checked by the decoder, e.g., decoder 144 (FIG. 1). In various embodiments, the stopping criterion may be satisfied when a prescribed maximum number of iterations have been performed or when c'$H^T$(C)=0, where is c' is a tentatively decoded codeword, and $H^T$(C) is the transposed parity check matrix of block error-correction code C (e.g., see Eq. (4)). In some embodiments, one or more alternative and/or additional stopping conditions can also be used. If the iteration-stopping criterion is not satisfied, then the processing of method 400 is directed back to step 404. If the iteration-stopping criterion is satisfied, then the processing of method 400 is directed to step 410.

At step 410, the sign bits of the current LLR values $L(s_1)$ through $L(s_r)$ are read from the processors of the variable nodes and presented to quantum-state recovery circuit 148 as the measured syndrome vector S=$(s_1, \ldots, s_r)$. As already indicated above, quantum-state recovery circuit 148 uses the received measured syndrome vector S to generate an appropriate stimulus for correcting an error (if any) in the entangled quantum state held in qubit buffer 134.

Additional examples of implementing such message-passing decoding algorithms and corresponding circuits useful for decoder 144 are disclosed, e.g., in U.S. Pat. Nos. 8,327,215, 7,805,654, 7,793,201, 7,676,734, 7,519,898, and 7,373,581, all of which are incorporated herein by reference in their entirety. One of ordinary skill in the art will understand how to make and use various alternative embodiments of decoder 144 and method 400 based on these patents. Also note that, in the pertinent literature, some message-passing decoding algorithms that might be suitable for use in decoder 144 may be referred to as sum-product algorithms or belief-propagation algorithms.

It should be recognized that the use of some block error-correction codes C results in better performance for memory system 100 than the use of others. Some of the better-performing block error-correction codes C can be constructed using a sparse (e.g., low-density) generator matrix G(C)= $[I_r|P]$ (also see Eq. (3)). For the generator matrix G(C) to be sparse, the corresponding parity-bit generator sub-matrix P needs to be sparse as well. For a sparse P, a representative parity bit, $p_j = s_{i1} + s_{i2} + \ldots + s_{it}$, is a sum of a relatively small number (t) of syndrome bits, where t<<r. This property also means that the binary vector $f_j$ (=$g_{i1}+g_{i2}+ \ldots +g_{it}$) corresponding to the block error-correction code C has a relatively small weight, wt($f_j$) (also see Eqs. (2) and (6)). The latter statement is true due to the following property of the weights:

$$wt(f_j) \le wt(g_{i1}) + wt(g_{i2}) + \ldots + wt(g_{it}) \quad (11)$$

In one embodiment, the above-described block error-correction code C having a sparse generator matrix G(C) can be a low-density generator-matrix (LDGM) code. LDGM codes are a subfamily of LDPC codes. In an alternative embodiment, the quantum stabilizer code used in memory system 100 can be a first LDPC code, while the block error-correction code C is a second LDPC code different from the first LDPC code. In one embodiment, each column in generator matrix G(C) has a weight that is smaller than 10% of (N−r).

Eq. (11) and Eq. (8) imply that a block error-correction code C having a sparse parity-bit generator sub-matrix P has relatively small values of $P_{err}(f_j)$. The relatively small values of $P_{err}(f_j)$ may further relatively high accuracy of syndrome measurements in the corresponding embodiment of syndrome-measurement circuit 140 (FIG. 1).

According to an embodiment of the disclosure, a block error-correction code C having a sparse parity-bit generator sub-matrix P may be improved for use in memory system 100 using an EXIT-function approach generally outlined, e.g., in U.S. Pat. Nos. 7,251,769 and 7,751,491, both of which are incorporated herein by reference in their entirety. In particular, the EXIT-function approach may be used to formulate an optimization problem, the solution of which can be used by the designer of memory system 100 to construct a block error-correction code C that is relatively optimal for a specific embodiment of memory system 100 under design. One possible formulation of this optimization problem according to an embodiment of the disclosure is provided below. One of ordinary skill in the art will readily understand how to numerically solve this optimization problem, e.g., using appropriate computational tools.

Suppose that our goal is to construct a parity-check matrix H(C)=$[P^T|I_{N-r}]$, in which all rows in the transposed parity-bit generator sub-matrix $P^T$ have the same constant weight, m. This means that in the corresponding bipartite graph (such as bipartite graph 300, FIG. 3), all check nodes have the same degree, m+1. For comparison, the degree of the variable nodes in bipartite graph 300 is not constant, but varies from 1 to 5. Recall that $P^T$ has r columns and (N−r) rows.

An EXIT-function analysis gives the following relationship between the values of N, m, and r:

$$r = N\left(1 - \left(1 + m\sum_{i=1}^{d} c_i/i\right)^{-1}\right) \quad (12)$$

where the set of $c_i$ values represents the column-weight distribution in $P^T$, with each individual $c_i$ value being the portion of "ones" that occur in columns of weight i; and d is the largest column weight in $P^T$. Due to the nature of quantum circuits, such as syndrome-measurement circuit 200 (FIG. 2A), it is beneficial to have a relatively small value of N, for example, to attempt to keep the value of N as small as possible, provided that other pertinent performance criteria are also met. In practice, the value of N may vary significantly in different embodiments and may have any value between about 10 and about $10^5$. Using Eq. (12), the corresponding optimization problem can be formulated as follows:

$$\text{maximize } \sum_{i=1}^{d} c_i/i \quad (13)$$

subject to the following constraint:

$$I_E^v(x) \ge (I_E^c)^{-1}(x), x \in [0, I_{out}^*) \quad (14)$$

where $I_E^v(x)$ is the EXIT function describing the processing in the variable nodes of the bipartite graph; $I_E^c(x)$ is the EXIT function describing the processing in the check nodes of the bipartite graph, with $(I_E^c)^{-1}$ denoting the corresponding inverse function; and $I_{out}^*$ is defined by the condition of $(I_E^c)^{-1}(I_{out}^*)=1$. The acronym EXIT stands for EXtrinsic Information Transfer. The constraint expressed by Eq. (14) in effect requires the two EXIT functions not to intersect over the specified range of the argument x.

If each of the r binary vectors $g_j$ representing the quantum stabilizer code Q (see Eq. (1)) have the same weight wt($g_j$)= $w_1$ (see Eq. (2)), then the probabilities $P_{err}(g_j)$ also have the same value $P_{err}(g_j)=P_1$ (see Eq. (8)). The value of $P_1$ depends on the particular realization of the corresponding quantum measurement circuit, such as syndrome-measurement circuit 140 (FIG. 1) or 200 (FIG. 2A), and can be estimated using Eq. (8). Furthermore, in this case, binary vectors $f_j$, which are generated based on $P^T$ as linear combinations of the binary vectors $g_j$, also have approximately the same weight $w_2 = mw_1$. As a result, the probabilities $P_{err}(f_j)$ similarly have approximately the same value $P_{err}(f_j) = P_2$ that can be estimated using an equation similar to Eq. (8).

The EXIT function $I_E^v(I_A)$ is a linear combination of the EXIT functions $I_E^v(I_A, t)$, as given by Eq. (15):

$$I_E^v(I_A) = \sum_{i=1}^{d} c_i I_E^v(I_A, i) \tag{15}$$

where $I_E^v(I_A, t)$ denotes the EXIT function of a variable node of degree t in the corresponding bipartite graph; and $I_A$ is the average extrinsic information about the bits of the codeword $(s_1, \ldots, s_r, p_1, \ldots, p_{N-r})$ contained in the messages passed along the edges in the bipartite graph. EXIT function $I_E^v(I_A, t)$ can in turn be approximated using the value of $P_1$ as follows:

$$I_E^v(I_A, t) = 1 - ((1-P_1)I_1 + P_1 I_2) \tag{16}$$

where:

$$I_1 = \int_{-\infty}^{+\infty} \frac{1}{2\pi\upsilon} \exp(-(x+\upsilon/2)^2 2\upsilon) \log_2\left(1 + \frac{P_1}{1-P_1} e^x\right) dx;$$

$$I_2 = \int_{-\infty}^{+\infty} \frac{1}{2\pi\upsilon} \exp(-(x+\upsilon/2)^2 2\upsilon) \log_2\left(1 + \frac{1-P_1}{P_1} e^x\right) dx;$$

$$\upsilon = (t-1)\upsilon_0; \text{ and}$$

$\upsilon_0$ is defined by $$I_A = \int_{-\infty}^{+\infty} \frac{1}{2\pi\upsilon_0} \exp(-(x-\upsilon_0/2)^2/2\upsilon_0) \log_2(1+e^{-x}) dx.$$

The EXIT function $I_E^c(I_A)$ can be approximated using the value of $P_2$ as follows:

$$I_E^c(I_A) = \sum_{i=1}^{\infty} \frac{1}{2i(2i-1)} \Phi_i(\upsilon/2)^{m-2} (1-2P_2)^{2i} \tag{17}$$

where:

$$\Phi_i(x) = \frac{1}{\sqrt{\pi x}} \int_{-1}^{1} \frac{2z^{2i}}{(1-z)^2} \exp\left(-\frac{\left(\ln\left(\frac{1+z}{1-z}\right) - x\right)^2}{4x}\right) dz; \text{ and}$$

$\upsilon$ is defined by $$I_A = \int_{-\infty}^{+\infty} \frac{1}{2\pi\upsilon} \exp(-(x-\upsilon/2)^2/2\upsilon) \log_2(1+e^{-x}) dx.$$

Figure 5:
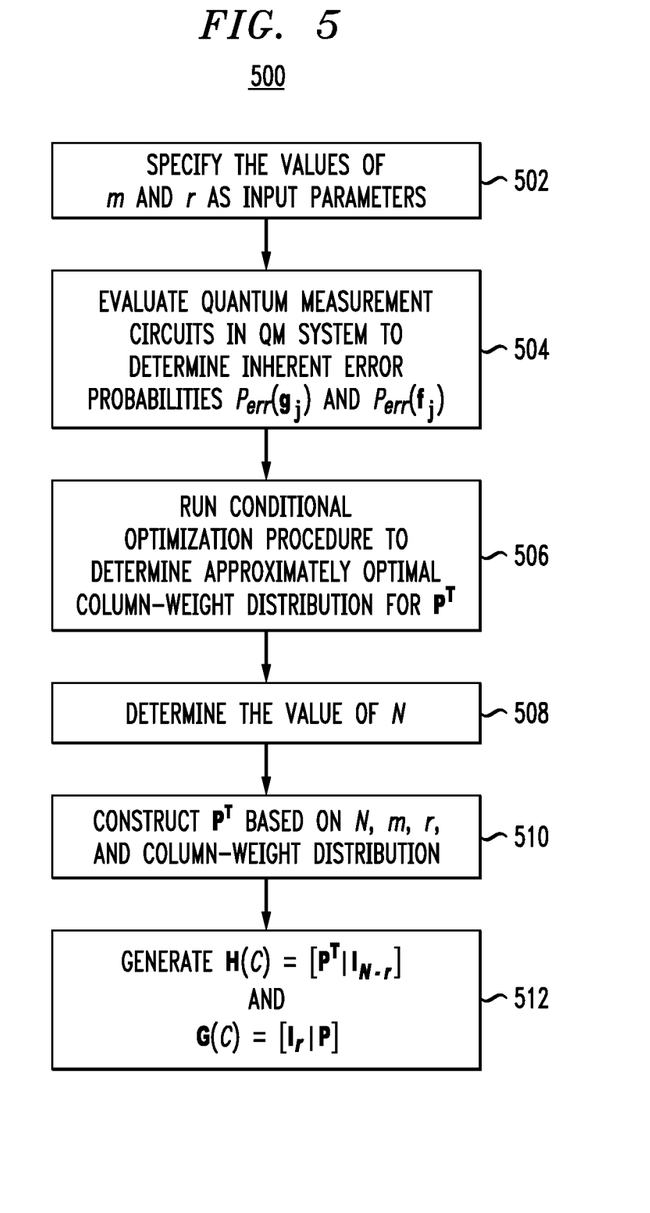
FIG. 5 shows a flowchart of a method of constructing a block error-correction code for the memory system of FIG. 1 according to an embodiment of the disclosure.

FIG. 5 shows a flowchart of a method 500 of constructing a block error-correction code for memory system 100 (FIG. 1) according to an embodiment of the disclosure. More specifically, method 500 is based on solving the optimization problem formulated in Eqs. (13) and (14).

At step 502 of method 500, the values of m and r are specified as input parameters. Recall that the value of r (=n−k) is the number of binary vectors g used in the quantum stabilizer code Q that will be used in the corresponding memory system in conjunction with the block error-correction code C that is being constructed using method 500. The value of m is the constant (fixed) weight of the rows in the transposed parity-bit generator sub-matrix $P^T$ of the block error-correction code C.

At step 504, the quantum circuitry, such as quantum measurement circuit 140 or 200, that is going to be used in the memory system is evaluated in terms of its inherent error probabilities $P_{err}(g_j)$ and $P_{err}(f_j)$, i.e., the probabilities that the measured syndrome and parity bits may have erroneous values. In one embodiment, these probabilities can be approximated using the above-mentioned values of $P_1$ and $P_2$, respectively. The relationship between the structure of the employed quantum measurement circuit and the error probabilities $P_{err}(g_j)$ and $P_{err}(f_j)$ has already been explained above in reference to Eqs. (7) and (8). The error probabilities $P_{err}(g_j)$ and $P_{err}(f_j)$ serve as additional input parameters in method 500.

At step 506, a conditional optimization procedure that solves the mathematical problem formulated in Eqs. (13) and (14) is run to determine an approximately optimal column-weight distribution (e.g., an optimal set of $c_i$ values) for the transposed parity-bit generator sub-matrix $P^T$. Recall that the condition expressed by Eq. (14) is based on the EXIT functions of the block error-correction code C and asserts that the EXIT functions corresponding to the variable and check nodes in the bipartite graph should not intersect. The conditional optimization procedure of step 506 relies on the parameters specified/determined in steps 502 and 504.

At step 508, the value of N is determined based on the column-weight distribution determined at step 506. In one embodiment, Eq. (12) can be used for this purpose. Recall that the value of N determines the number of measurement modules in the corresponding quantum measurement circuit, such as measurement modules 210 in quantum measurement circuit 200 (FIG. 2A). The value of N also determines the size of the transposed parity-bit generator sub-matrix $P^T$, which has r columns and (N−r) rows.

At step 510, the transposed parity-bit generator sub-matrix $P^T$ is constructed using the value of N determined at step 508, the column-weight distribution determined at step 506, and the values of m and r specified at step 502.

At step 512, the transposed parity-bit generator sub-matrix $P^T$ is used to generate the parity-check matrix H(C) and the generator matrix G(C) for the block error-correction code C. Recall that $H(C) = [P^T | I_{N-r}]$, and $G(C) = [I_r | P]$. One skilled in the art will understand that matrices H(C) and G(C) fully define the block error-correction code C.

According to one embodiment, provided is a machine-implemented method of constructing a block error-correction code, the method comprising: selecting a quantum stabilizer code (e.g., Q) for a quantum-memory system (e.g., 100); determining inherent error probabilities for a quantum-measurement circuit (e.g., 200) in the quantum-memory system; determining a column-weight distribution for a transposed parity-bit generator sub-matrix (e.g., $P^T$) of the block error-correction code based on the quantum stabilizer code and said inherent error probabilities; constructing the transposed parity-bit generator sub-matrix having the determined column-weight distribution; and generating a parity-check matrix (e.g., H(C)) and a generator matrix (e.g., G(C)) for the block error-correction code based on the constructed transposed parity-bit generator sub-matrix.

In some embodiments of the above method, all rows in the transposed parity-bit generator sub-matrix of the block error-correction code have a same constant weight (e.g., m).

In some embodiments of any of the above methods, the step of determining the column-weight distribution comprises running a conditional optimization procedure that approximately maximizes a sum of scaled column weights (e.g., Eq.

(13)) under a condition that EXIT functions corresponding to variable and check nodes of a bipartite graph of the block error-correction code do not to intersect.

In some embodiments of any of the above methods, the step of determining the inherent error probabilities comprises: deriving a first error-probability estimate (e.g., $P_1$) based on a circuit structure of a measurement module (e.g., $210_1$) in the quantum-measurement circuit configured to measure a syndrome bit; and deriving a second error-probability estimate (e.g., $P_2$) based on a circuit structure of a measurement module (e.g., $210_5$) in the quantum-measurement circuit configured to measure a parity bit.

A sparse binary matrix is a matrix populated primarily with zeros. By contrast, if a larger number of elements are ones, then the matrix is referred to as a dense matrix. The fraction of zero elements (non-zero elements) in the total number of elements in a matrix is called the sparsity (density) of the matrix. The sparsity and density values can be presented as absolute fractional values (in the range between 0 and 1) or as percentages.

In one embodiment, the parity-bit generator sub-matrix P has a density that is smaller than about 0.4 (or 40%). In a possible embodiment, the parity-bit generator sub-matrix P has a density that is between about 0.05 (or 5%) and about 0.25 (or 25%). In yet another possible embodiment, the parity-bit generator sub-matrix P has a density that is smaller than about 0.1 (or 10%).

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Some embodiments may be implemented as circuit-based processes, including possible implementation on a single integrated circuit.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled or referred-to as "processors," "controllers," "decoders," and "logic circuits" may be provided through the use of dedicated hardware as well as hardware capable of executing software in association with appropriate software. Moreover, explicit use of these terms should not be construed to refer exclusively to hardware capable of executing software, and may implicitly include, without limitation, digital signal processor (DSP) hardware, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising:
   a register configured to store a coded entangled qubit state generated using a quantum stabilizer code;
   a measurement circuit configured to perform a redundant measurement of a set of syndrome values corresponding to the coded entangled qubit state, wherein the redundant measurement is performed based on a low-density parity-check (LDPC) error-correction code; and
   a decoder configured to apply the LDPC error-correction code to correct a measurement error in the set of syndrome values.

2. The apparatus of claim 1, wherein the LDPC error-correction code is a low-density generator-matrix code.

3. The apparatus of claim 1, wherein the LDPC error-correction code has a sparse parity-bit generator sub-matrix.

4. The apparatus of claim 3, wherein the parity-bit generator sub-matrix has a density that is smaller than about 10%.

5. The apparatus of claim 3, wherein the parity-bit generator sub-matrix has a density that is between about 5% and about 25%.

6. The apparatus of claim 1, wherein all rows in a transposed parity-bit generator sub-matrix of the LDPC error-correction code have a same constant weight.

7. The apparatus of claim 6, wherein the transposed parity-bit generator sub-matrix has a column-weight distribution that causes EXIT functions corresponding to variable and check nodes of a bipartite graph of the LDPC error-correction code not to intersect.

8. The apparatus of claim 1, further comprising a state-recovery circuit configured to correct an error in the coded entangled qubit state based on a syndrome value received from the decoder.

9. The apparatus of claim 8, wherein the state-recovery circuit is further configured to:
determine, based on a corrected set of syndrome values, an error operator corresponding to a probable error in the coded entangled qubit state; and
process the coded entangled qubit state based on the error operator in a manner that corrects the probable error therein.

10. The apparatus of claim 8, further comprising an array for storing a plurality of coded entangled qubit states, wherein the apparatus is configured to:
transfer a selected coded entangled qubit state from the array to the register; and
transfer the selected coded entangled qubit state from the register to the array in response to modifying the selected entangled qubit state based on the error operator.

11. The apparatus of claim 1, wherein the measurement circuit comprises:
a first set of measurement modules coupled to the register, wherein each measurement module is configured to measure a respective syndrome value of the coded entangled qubit state based on a respective one of first binary vectors;
a second set of measurement modules coupled to the register, wherein each measurement module is configured to measure a respective parity value of the coded entangled qubit state based on a respective one of second binary vectors, wherein each parity value is related to some of the syndrome values as defined by the LDPC error-correction code.

12. The apparatus of claim 11, wherein:
the measurement module in the first set comprises a respective soft-output detector configured to generate the respective syndrome value as a log-likelihood-ratio (LLR) value; and
the measurement module in the second set comprises a respective soft-output detector configured to generate the respective parity value as an LLR value.

13. The apparatus of claim 12, wherein the decoder is configured to correct the measurement error by executing a message-passing decoding algorithm corresponding to the LDPC error-correction code.

14. The apparatus of claim 13, wherein said message-passing decoding algorithm is initialized using the LLR values generated by the measurement modules.

15. The apparatus of claim 11, wherein a measurement module in the measurement circuit comprises:
a sequence of quantum gates connected to the register and configured to process a reference multi-qubit state by coupling the coded entangled qubit state to the reference multi-qubit state; and
a logic circuit configured to estimate a syndrome value or a parity value of the coded entangled qubit state from measurements on the processed reference multi-qubit state performed by the sequence of quantum gates.

16. The apparatus of claim 15, wherein the logic circuit is configured to:
estimate a respective binary syndrome sub-value or a respective binary parity sub-value from a measurement on individual qubits of the processed reference multi-qubit state; and
the circuit comprises a multi-input XOR gate configured to process said binary sub-values to estimate the syndrome value or the parity value.

17. The apparatus of claim 15, wherein the logic circuit comprises a soft-output detector configured to generate a soft estimate of the syndrome value or of the parity value.

18. The apparatus of claim 1, wherein the coded entangled qubit state is generated using the quantum stabilizer code that is a different LDPC code compared to the LDPC code used for the redundant measurement.

* * * * *